US012687592B2

(12) United States Patent
Tatarczak et al.

(10) Patent No.: US 12,687,592 B2
(45) Date of Patent: Jul. 21, 2026

(54) PCSEL MAGNETOMETER

(71) Applicant: II-VI Delaware, Inc., Wilmington, DE (US)

(72) Inventors: Anna Tatarczak, Wilmington, DE (US); Christopher Kocot, Wilmington, DE (US); Young-Kai Chen, Wilmington, DE (US); Giovanni Barbarossa, Wilmington, DE (US)

(73) Assignee: II-VI Delaware, Inc., Wilmington, DE (US)

( * ) Notice: Subject to any disclaimer, the term of this patent is extended or adjusted under 35 U.S.C. 154(b) by 137 days.

(21) Appl. No.: 18/626,596

(22) Filed: Apr. 4, 2024

(65) Prior Publication Data

US 2025/0314718 A1 Oct. 9, 2025

(51) Int. Cl.
　　*G01R 33/032* (2006.01)
　　*G01R 33/26* (2006.01)
　　*H01S 5/042* (2006.01)
　　*H01S 5/11* (2021.01)

(52) U.S. Cl.
　　CPC ........... *G01R 33/032* (2013.01); *G01R 33/26* (2013.01); *H01S 5/0425* (2013.01); *H01S 5/11* (2021.01)

(58) Field of Classification Search
　　CPC ..... G01R 33/032; G01R 33/26; H01S 5/0425; H01S 5/11
　　USPC .......................................................... 324/304
　　See application file for complete search history.

(56) References Cited

U.S. PATENT DOCUMENTS 5,091,697 A　*　2/1992　Roth .................... G01R 33/045
　　　　　　　　　　　　　　　　　　　　324/253
7,322,704 B2　1/2008　Shchegrov
7,920,612 B2　4/2011　Johnson et al.
　　　　　　　　　(Continued)

FOREIGN PATENT DOCUMENTS

DE　　102017205268　　10/2018
EP　　　　4119938　　　1/2023
　　　　　　(Continued)

OTHER PUBLICATIONS

Dumeige, Yannick, et al. "Infrared laser threshold magnetometry with a NV doped diamond intracavity etalon." Optics express 27.2 (2019): 1706-1717. (Year: 2019).*

(Continued)

*Primary Examiner* — Christopher P McAndrew
(74) *Attorney, Agent, or Firm* — McAndrews, Held & Malloy, Ltd.

(57) ABSTRACT

A magnetometer includes a resonant atomic medium, a photonic crystal surface emitting laser (PCSEL), and a light detector. The resonant atomic medium includes color centers or other dopants that form vacancies that fluoresce light when excited by an excitation light having an excitation wavelength. Characteristics of the fluoresced light are dependent upon a magnetic field applied to the resonant atomic medium. The PCSEL is configured to develop the excitation light having the excitation wavelength of the vacancies and direct the excitation light into the resonant atomic medium. The light detector is configured to receive the fluoresced light and generate a measurement signal indicative of the fluoresced light and the magnetic field applied to the resonant atomic medium.

23 Claims, 5 Drawing Sheets

(56) References Cited

U.S. PATENT DOCUMENTS

| | | | | |
|---|---|---|---|---|
| 8,686,722 | B2 * | 4/2014 | Mohan | G01R 33/04 |
| | | | | 324/253 |
| 10,056,732 | B2 | 8/2018 | Wisdom | |
| 10,502,547 | B2 | 12/2019 | Baier et al. | |
| 2007/0147444 | A1 | 6/2007 | Kim | |
| 2007/0268941 | A1 | 11/2007 | Kim et al. | |
| 2008/0151949 | A1 | 6/2008 | Takeda | |
| 2009/0243594 | A1 * | 10/2009 | Kahlman | G01R 33/1269 |
| | | | | 324/252 |
| 2014/0320123 | A1 * | 10/2014 | Kobayashi | G01R 33/26 |
| | | | | 324/244.1 |
| 2014/0375313 | A1 * | 12/2014 | Salit | G01R 33/032 |
| | | | | 324/301 |
| 2017/0363696 | A1 * | 12/2017 | Hahn | G01R 33/0023 |
| 2019/0018091 | A1 * | 1/2019 | Lew | G01R 33/26 |
| 2019/0219645 | A1 * | 7/2019 | Hahn | G01R 33/26 |
| 2019/0391215 | A1 * | 12/2019 | Osaka | G01R 33/26 |
| 2022/0091200 | A1 * | 3/2022 | Gerginov | G01R 33/26 |
| 2023/0089110 | A1 * | 3/2023 | Gider | G01R 33/0017 |
| | | | | 324/252 |
| 2023/0243901 | A1 * | 8/2023 | Shcherback | G01R 33/26 |
| | | | | 324/304 |

FOREIGN PATENT DOCUMENTS

| | | |
|---|---|---|
| JP | 2005-318462 | 11/2005 |
| JP | 2017-67650 | 4/2017 |
| JP | 2019-515508 | 6/2019 |
| JP | 2021-15113 | 2/2021 |
| JP | 2021-507240 | 2/2021 |
| JP | 2022082406 | 6/2022 |
| JP | 2023-20552 | 2/2023 |
| JP | 7338787 | 9/2023 |
| WO | 2022163678 | 8/2022 |

OTHER PUBLICATIONS

Pontula, Sahil. Developing and Characterizing Sources of Quantum States of Light: from Single Photons to Million-Photon Fock States. Diss. Massachusetts Institute of Technology, 2023. (Year: 2023).*

Hsu, Wen-Cheng, et al. "Metasurface-and PCSEL-based structured light for monocular depth perception and facial recognition." Nano letters 24.5 (2024): 1808-1815. (Year: 2024).*

Noda, Susumu, et al. "High-power and high-beam-quality photonic-crystal surface-emitting lasers: a tutorial." Advances in Optics and Photonics 15.4 (2023): 977-1032. (Year: 2023).*

Iadanza, S., et al. "Photonic crystal lasers: from photonic crystal surface emitting lasers (PCSELs) to hybrid external cavity lasers (HECLs) and topological PhC lasers." Optical Materials Express 11.9 (2021): 3245-3274. (Year: 2021).*

"Vertical-external-cavity surface-emitting-laser", Wikipedia, 2 pages.

"Nitroen-vacancy center", Wikipedia, 20 pages.

"Photonic Crystal Surface-emitting Lasers", Basic Architecture and Operation Principles, Mar. 15, 2024, 8 pages.

"Vescel basics", Ultrafast Laser Physics, Mar. 11, 2024, 6 pages.

Extended European Search Report for Application No. 25155663, completed Jul. 16, 2025, 10 pages.

"The Future of Photonic Crystal Surface-Emitting Lasers", Zhou Weidong, et al., American Institute of Physics, vol. 123, No. 14, p. 140501-1 to 140501-9.

"High-Sensitivity Three-Axis Vector Magnetometry Using Electron Spin Ensembles in Single-Crystal Diamond", IEEE Magnetics Letters, vol. 10, Jan. 9, 2019, 4 pages.

"Infrared Vertical External Cavity Surface Emitting Laser Threshold Magnetometer", Aplied Physics Letters, American Institute of Physics, vol. 124, No. 9, Mar. 1, 2024, p. 091110-1 to 091110-5.

Japan Patent Office, Office Action, Appln No. 2025-018154, dated Jan. 23, 2026, 11 pages.

* cited by examiner

202

Upper Mirror
250

Cladding Layer   240

Photonic Crystal   230

Active Region   220

Cladding Layer   210

Meta Optical Surface   280 p
260 n
270

Resonant Atomic
Medium Substrate
100

F

X

Fluoresced Light Detector
300

12

204

F

X

Fluoresced Light Detector
301

RAM Layer    400

Cladding Layer    240

Photonic Crystal    230

Active Region    220

Cladding Layer    210

Lower Mirror    252 n
270 p
260

Substrate
101

14

PCSEL MAGNETOMETER

TECHNICAL FIELD

Aspects of the present disclosure are related to magnetometry, and in particular to optical magnetometers.

BACKGROUND

Conventional magnetometers are often limited by size, complexity, and sensitivity.

BRIEF SUMMARY OF THE DISCLOSURE

Shown in and/or described in connection with at least one of the figures, and set forth more completely in the claims are optical magnetometers that utilize a photonic crystal surface emitting laser (PCSEL) and a resonant atomic medium to measure magnetic fields.

These and other advantages, aspects and novel features of the present disclosure, as well as details of illustrated embodiments thereof, will be more fully understood from the following description and drawings.

BRIEF DESCRIPTION OF THE DRAWINGS

Various features and advantages of the present disclosure may be more readily understood with reference to the following detailed description taken in conjunction with the accompanying drawings, wherein like reference numerals designate like structural elements.

DESCRIPTION

Figure 1:
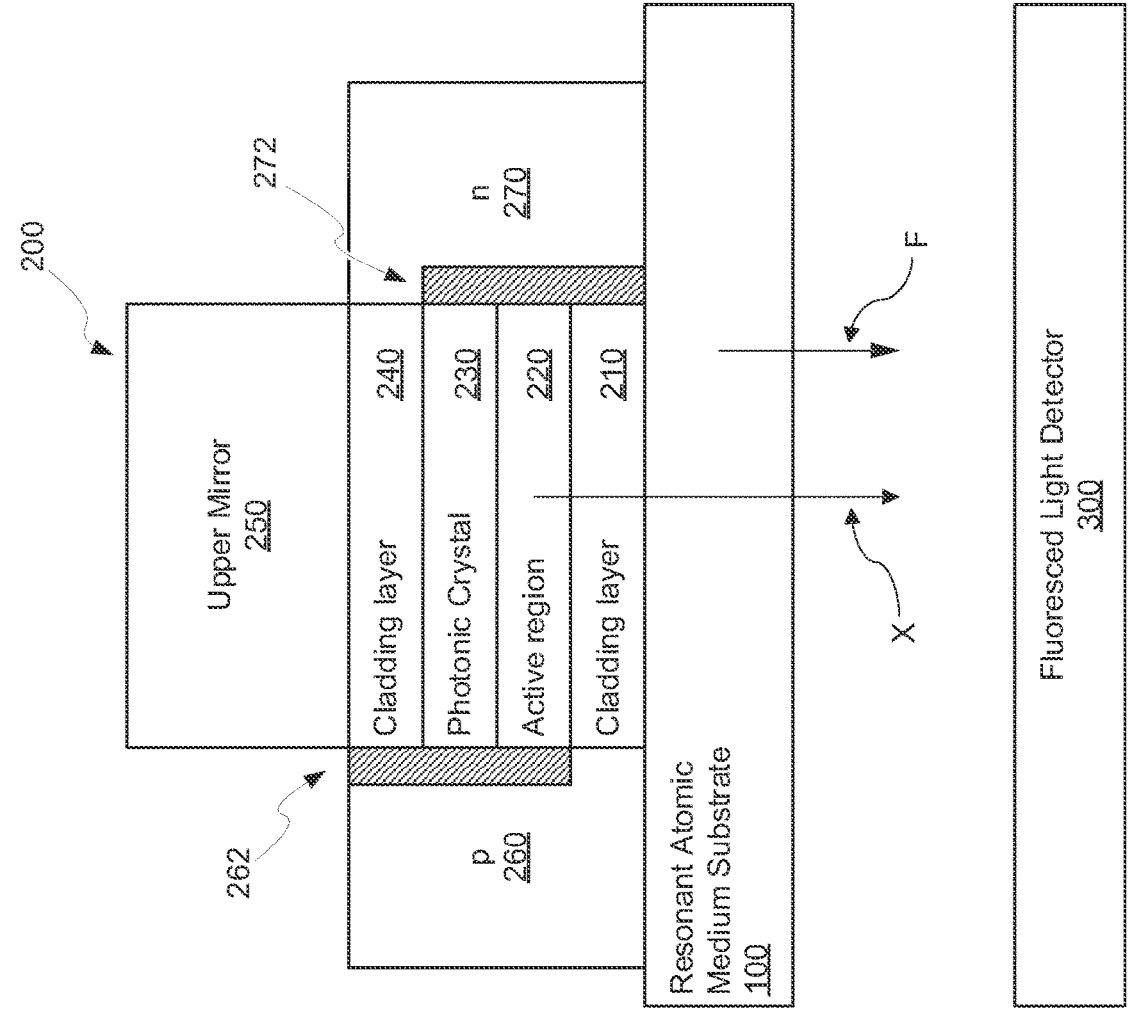
FIG. 1 depicts a magnetometer with a photonic crystal surface emitting laser (PCSEL) on a resonant atomic medium substrate in accordance with various aspects of the present disclosure.

The following discussion provides various examples of optical magnetometers that utilize a photonic crystal surface emitting laser (PCSEL) and a resonant atomic medium to measure magnetic fields. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

Aspects of the present disclosure are directed to magnetometry and an optical magnetometer. In various embodiments, the optical magnetometer comprises a photonic crystal surface emitting laser (PCSEL) and diamond or silicon carbide with color centers used as a resonant atomic medium. The resonant atomic medium may impart the PCSEL with magnetic field detection capabilities. By incorporating the resonant atomic medium (e.g., diamond, silicon carbide, etc.), a more compact, sensitive, and/or efficient magnetometer may be obtained in comparison to conventional techniques.

Referring now to FIG. 1, an example optical magnetometer 10 is shown. The optical magnetometer 10 may include a resonant atomic medium (RAM) substrate 100, a PCSEL 200, and a fluoresced light detector 300. In general, the PCSEL 200 emits light X having an excitation wavelength. The excitation light X may be directed into the RAM substrate 100 and the color centers embedded in the RAM substrate 100 may fluoresce light F in a manner that is dependent or otherwise indicative of a magnetic field experienced by the RAM substrate 100. The fluoresced light detector 300 may receive the fluoresced light F and generate a fluoresced measurement signal indicative of the detected fluoresced light and thus also indicative of the magnetic field experienced by the RAM substrate 100. In this manner, the optical magnetometer 10 may detect and/or measure a magnetic field proximate the optical magnetometer 10.

The RAM substrate 100 may comprise diamond or silicon carbide (SIC) embedded with color centers, which form vacancies (e.g., nitrogen-vacancies in diamond, silicon-vacancies in SiC) that fluoresce in response to excitation light X having an excitation wavelength. Moreover, the fluorescence of such vacancies may vary based on a magnetic field applied to the RAM substrate 100. In particular, under an applied magnetic field, atomic spins within the vacancy centers may be deflected and may lead to energy shifts observable through changes in absorption or photoluminescence. These energy shifts correspond to alterations in fluoresced light F and may be monitored by the fluoresced light detector 300 of the magnetometer 10. Through such detected energy shifts, characteristics of the magnetic field may be determined.

To supply the RAM substrate 100 with the excitation light X, the PCSEL 200 may be formed on a top side of the RAM substrate 100. The PCSEL 200 may be constructed to emit light X from its bottom surface or bottom side and into the top side of the RAM substrate 100. Moreover, the PCSEL 200 may be constructed to emit light X having the excitation wavelength for color centers of the RAM substrate 100. As such, the emitted excitation light X may be directed into the RAM substrate 100 and fluoresce color centers of the RAM substrate 100.

As shown, the PCSEL 200 may be constructed on the top side of the RAM substrate 100 as a stack of layers. In particular, PCSEL stack may include a lower cladding layer 210, an active region 220, a photonic crystal 230, an upper cladding layer 240, and an upper Bragg reflector (DBR) stack or mirror 250. In particular, a bottom side of the lower cladding layer 210 may be on the top side of the RAM substrate 100, a bottom side of the active region 220 may be on a top side of the lower cladding layer 210, and a bottom side of the photonic crystal 230 may be on a top side of the active region 220. Further, a bottom side of the upper cladding layer 240 may be on a top side of the photonic crystal 230, and a bottom side of the upper mirror 250 may be on a top side of the upper cladding layer 240.

The PCSEL 200 may further include a p contact 260 and an n contact 270 on the top side of the RAM substrate 100. The p contact 260 may be electrically coupled to the lower cladding layer 210. Similarly, the n contact 270 may be electrically coupled to the upper cladding layer 240. As further shown, the PCSEL 200 may include an electrical isolation region 262 that electrically isolates the p contact 260 from lateral sides of the active region 220, the photonic crystal 230, and the upper cladding layer 240. The PCSEL 200 may further include an electrical isolation region 272 that electrically isolates the n contact 270 from lateral sides of the lower cladding layer 210, the active region 220, and the photonic crystal 230.

The depicted placement of the p contact 260 and the n contact 270 is merely an example. Other embodiments may position the p contact 260 and n contact 270 differently. For example, the p contact 260 and n contact 270 may be swapped such that the p contact 260 is coupled to the upper cladding layer 240 and the n contact 270 is coupled to the lower cladding layer 210. The active region 220 may comprise quantum wells, quantum dots, and/or quantum dashes, which may be electrically pumped via the p contact 260 and the n contact 270 via respective electrodes of the cladding layers 210, 240. Such electrical pumping of the PCSEL 200 may cause the active region 220 to emit light and develop excitation light X via the photonic crystal 230. In some embodiments, the PCSEL 200 may develop the excitation light X at an excitation wavelength suitable for exciting vacancies of the RAM substrate 100. In some embodiments, the p contact 260 and n contact may electrically pump the PCSEL 200 so as to develop excitation light X that is continuous, frequency modulated, and/or polarized, which may improve the magnetometer sensitivity.

The photonic crystal 230 may comprise a thin layer of semiconductor material that functions as a lateral cavity (i.e., cavity that extends parallel to the top side of the RAM substrate 100). In particular, the photonic crystal may comprise a thin layer of gallium arsenide (GaAs), gallium nitride (GaN), indium phosphide (InP), or another semiconductor material. Moreover, the photonic crystal 230 may include a pattern (e.g., square, triangular, etc.) of air, or other dielectric material, holes that span a certain area. The photonic crystal 230 may also be transparent to the light having the excitation wavelength that is suitable for exciting the color centers of the RAM substrate 100.

The active region 220 may be coupled to the photonic crystal 230 and may provide laser gain through stimulated emission. The active region 220 may be separated from the photonic crystal 230 by a thin electron blocking layer that keeps the electrical carriers confined in the active region 220.

As shown, the active region 220 and the photonic crystal 230 may be sandwiched between the lower cladding layer 210 and the upper cladding layer 240. In particular, the bottom side of the upper cladding layer 240 is on the top side of the photonic crystal 230 and the lower side of the active region 220 is on the top side of the lower cladding layer 210. While the active region 220 is depicted below the photonic crystal 230 in FIG. 1, the positions of the active region 220 and the photonic crystal 230 may be swapped in some embodiments of the PCSEL 200. In such embodiments, the bottom side of the active region 220 may be on the top side of the photonic crystal 230. Further, the bottom side of the upper cladding layer 240 may be on the top side of the active region 220 and the lower side of the photonic crystal 230 may be on the top side of the lower cladding layer 210.

Regardless, the upper cladding layer 240 may comprise n-doped semiconductor material that is electrically conductive and optically transparent to the excitation wavelength. Similarly, the lower cladding layer 210 may comprise p-doped semiconductor material that is electrically conductive and optically transparent to the excitation wavelength. As a result, the cladding layers 210, 240 may electrically pump the PCSEL 200 while also permitting the excitation light X to pass through and to the top side of the RAM substrate 100.

In some embodiments, the RAM substrate 100 may comprise a diamond substrate. The diamond substrate may be embedded with nitrogen-vacancy (NV) centers. The NV centers may provide point defects or lattice vacancies in the diamond lattice structure that exhibit spin-dependent photoluminescence in the presence of a magnetic field. In particular, the NV centers may fluoresce red light F such as, for example, light with a wavelength of about 750 nm (e.g., 750 nm±20 nm) when excited by visible green light X such as, for example, light with a wavelength of about 532 nm (e.g., 532 nm±20 nm).

In some embodiments, the RAM substrate 100 may comprise a silicon carbide (SiC) substrate. The SiC substrate may be similarly embedded with color centers from silicon-vacancies or other dopants. These color centers in the SiC lattice structure may exhibit spin-dependent photoluminescence in the presence of a magnetic field. In particular, the silicon-vacancy color centers may fluoresce light F with a wavelength of about 919 nm (e.g., 919 nm±20 nm) when excited by visible red light X such as, for example, light with a wavelength of about 785 nm (e.g., 785 nm±20 nm).

As explained above, the RAM substrate 100 may provide the magnetometer 10 with magnet sensing capabilities. However, in additional to such sensing capabilities, the RAM substrate 100 may also act as a heat sink due to its thermal properties. In particular, such thermal properties may provide temperature stabilization, which may help assure wavelength stability of the excitation light X emitted from the bottom side of the PCSEL 200 and into the top side of the RAM substrate 100.

While diamond and silicon carbide are presented as examples of resonant atomic medium, other crystalline structures may be embedded with color centers and may be used as the resonant atomic medium of the magnetometers disclosed herein. For such embodiments, the PCSEL 200 may be configured to develop excitation light X at a wavelength that is suitable to excite photoluminescence of the embedded color centers.

The upper mirror 250 may reflect the excitation light X toward the bottom side of the PCSEL 200 and into the top side of the RAM substrate 100. Moreover, the RAM substrate 100 may be transparent to the wavelength of the fluoresced light F and the wavelength of the excitation light X, thus permitting the fluoresced light detector 300 to receive and detect the fluoresced light F.

The fluoresced light detector 300 may be designed with a narrow pass band filter and/or a narrow wavelength detection range. Such narrow pass band may effectively filter the excitation light X from the fluoresced light F. In some embodiments, the fluoresced light detector 300 regardless of the presence or absence of a narrow pass band filter may be designed to otherwise extract or detect the fluoresced light F in the presence of the excitation light X.

As depicted the fluoresced light detector 300 may be placed below the RAM substrate 100 to receive the fluoresced light F. The fluoresced light detector 300 may be designed to detect a wavelength range of interest (e.g., a wavelength range including the fluoresced light F) and generate a fluoresced measurement signal indicative of the detected light in the wavelength range of interest and the magnetic field effects upon the fluoresced light F. For example, the fluoresced light detector 300 may be configured to detect fluoresced light Fin a wavelength range of 600-800 nm when used with a diamond RAM substrate 100 that fluoresces red light of about 750 nm. The fluoresced light detector 300 and/or magnetometer 10 may include additional filters that permit a narrow range of light to reach the detecting elements (e.g., photodiode) of the fluoresced light detector 300.

Figure 2:
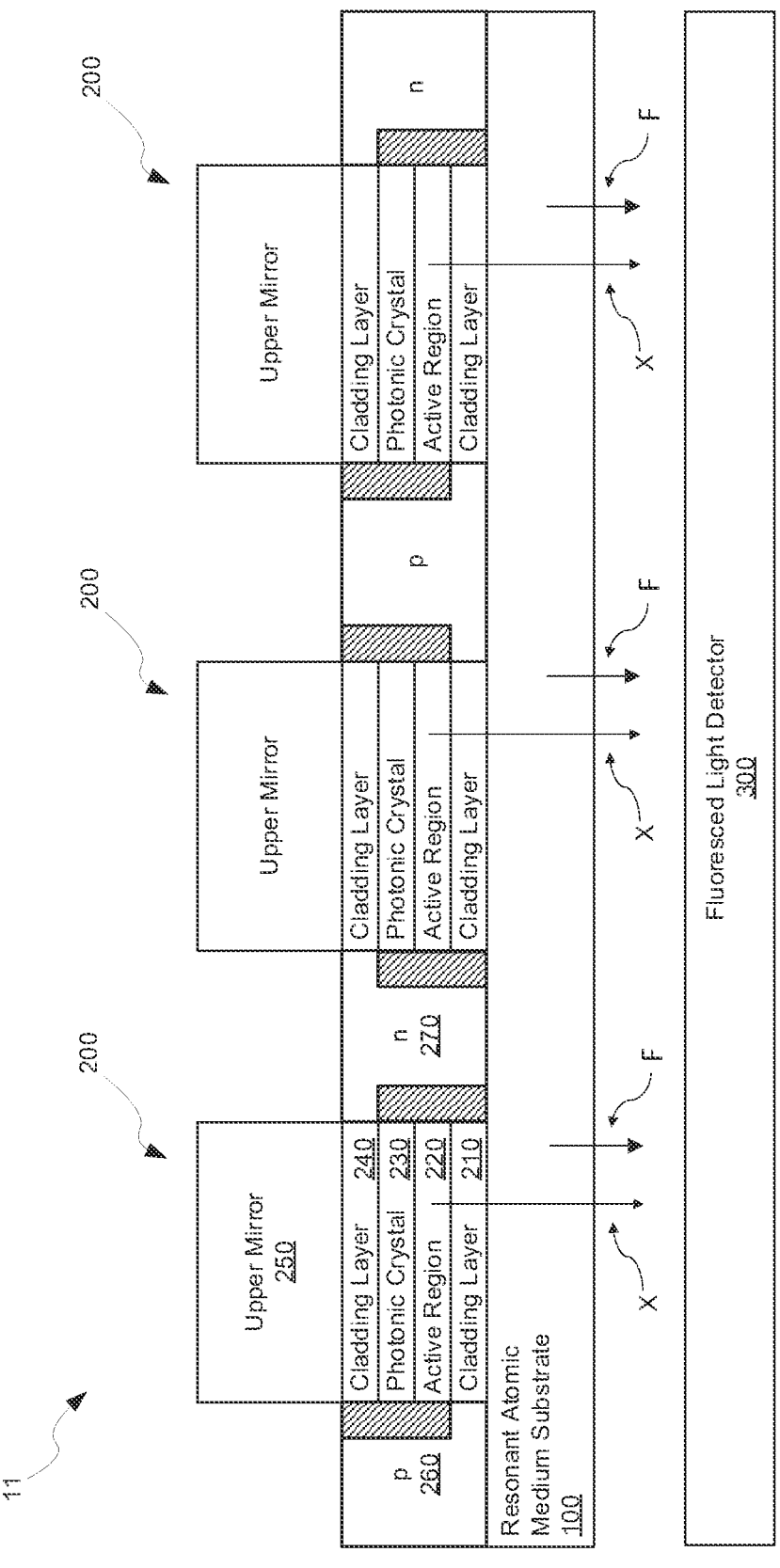
FIG. 2 depicts a magnetometer with an array of PCSELs on a resonant atomic medium substrate in accordance with various aspects of the present disclosure.

Referring now to FIG. 2, an optical magnetometer 11 comprising multiple PCSELs 200 on a top side of a RAM substrate 100 is shown. The optical magnetometer 11 may be implemented in a manner similar to the optical magnetometer 10 of FIG. 1. However, due to the presence of multiple PCSELs 200, the optical magnetometer 11 may excite multiple portions of the RAM substrate 100. As such, multiple portions of the RAM substrate 100 may supply the fluoresced light detector 300 with fluoresced light F. The fluoresced light detector 300 may generate a fluoresced measurement signal based on the fluoresced light F from multiple sources. Such a configuration effectively increases the amount of fluoresced light F generated in the presence of a magnetic field and potentially increases the sensitivity and/or accuracy of the optical magnetometer 11 compared to the optical magnetometer 10 of FIG. 1.

Further as shown in FIG. 2, individual p contacts 260 and/or n contacts 270 may be shared or coupled to multiple PCSELs 200. Such a configuration may aid in reducing the surface area consumed by the multiple PCSELs 200. Moreover, such a configuration may reduce the number of electrical leads or connections required to electrically pump the PCSELs 200.

Moreover, FIG. 2 depicts a linear arrangement of three PCSELs 200. However, the optical magnetometer 11 may be implemented with other arrangements such as, for example, PCSELs 200 arranged in a two-dimensional array, PCSELs 200 arranged in a two-dimensional torus arrangement, etc.

Moreover, the optical magnetometer 11 may be implemented with a different quantity of the PCSELs 200 than that depicted.

In some embodiments, all PCSELs 200 may be electrically pumped at the same time, which may increase the amount of fluoresced light F and sensitivity of the magnetometer 11. However, in some embodiments, the PCSELs 200 may be electrically pumped separately, sequentially, etc. Such selectivity may permit reducing power consumption and/or heat generation of the magnetometer 11.

Figure 3:
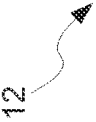
FIG. 3 depicts a magnetometer with a PCSEL with a meta optical surface on a resonant atomic medium substrate in accordance with various aspects of the present disclosure.

Referring now to FIG. 3, an optical magnetometer 12 is shown that comprises PCSEL 202 having a meta optical surface 280. The optical magnetometer 12 may be implemented in a manner similar to the optical magnetometer 10 of FIG. 1. However, unlike PCSEL 200 of FIG. 1, the PCSEL 202 of FIG. 3 comprises a meta optical surface 280 between the bottom side of the lower cladding layer 210 and the top side of the RAM substrate 100. In general, PCSELs emit light that is rather collimated. Due to the collimated nature of the emitted excitation light X, the PCSEL 200 of FIG. 1 may excite a small area of the RAM substrate 100. The meta optical surface 280 of PCSEL 202 may provide beam shaping of the excitation light X and cause the excitation light X to excite a larger area of the RAM substrate 100. As such, the meta optical surface 280 may increase the sensitivity and/or accuracy of the optical magnetometer 12 in comparison to the optical magnetometer 10 of FIG. 1.

Figure 4:
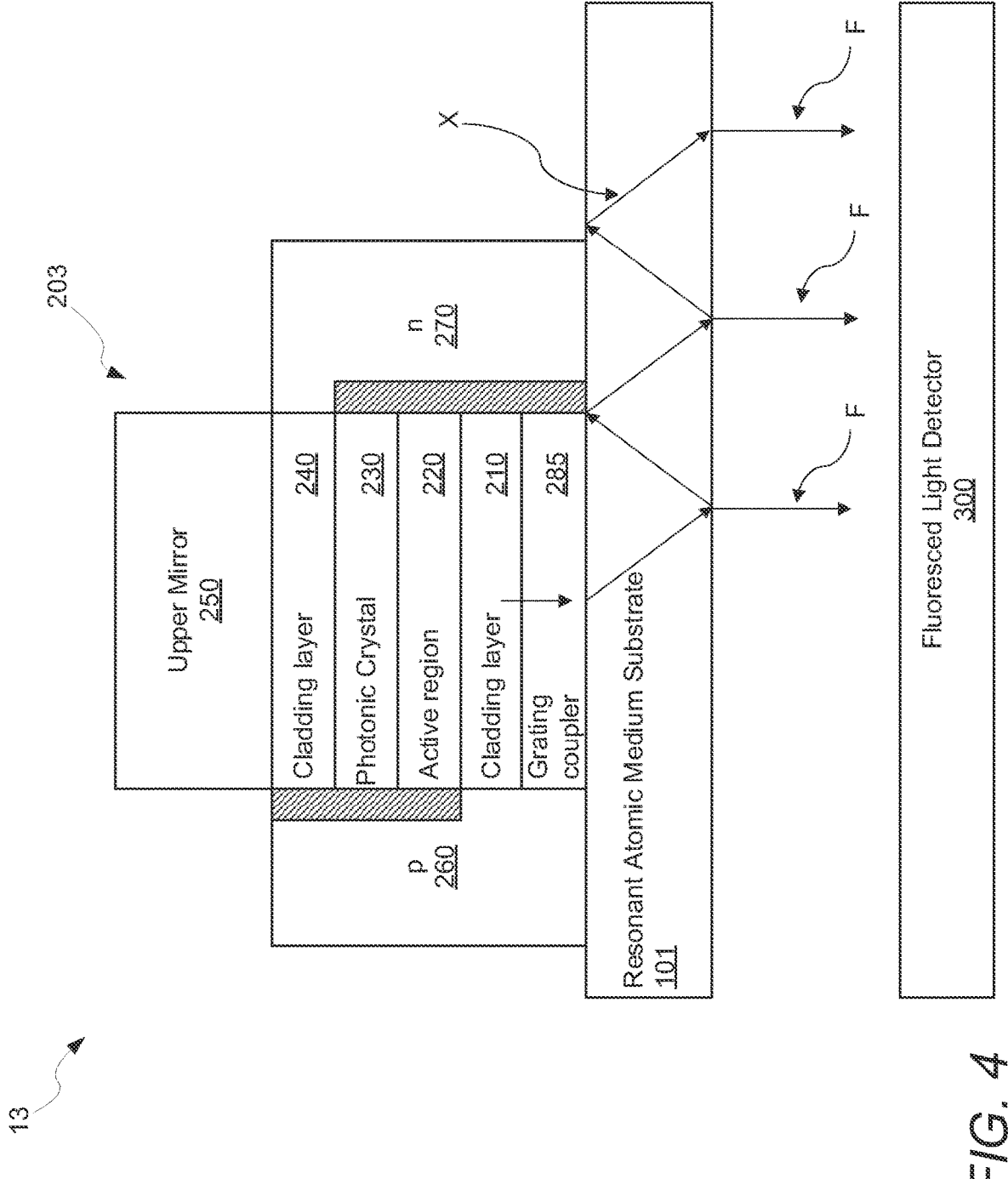
FIG. 4 depicts a magnetometer with a PCSEL with a grating coupler on a resonant atomic medium substrate in accordance with various aspects of the present disclosure.

Referring now to FIG. 4, an optical magnetometer 13 is shown that comprises PCSEL 203 having a grating coupler 285. The optical magnetometer 12 may be implemented in a manner similar to the optical magnetometer 10 of FIG. 1. However, unlike PCSEL 200 of FIG. 1, the PCSEL 203 of FIG. 4 comprises a grating coupler 285 between the bottom side of the lower cladding layer 210 and the top side of the RAM substrate 100. As noted above, PCSELs emit light that is rather collimated. Due to the collimated nature of the emitted excitation light X, the PCSEL 200 of FIG. 1 may excite a small area of the RAM substrate 100. The grating coupler 285 may direct and couple the excitation light X of the PCSEL 202 into the RAM substrate 100 at an angle.

Surfaces of the RAM substrate 100 may be designed to reflect the excitation light X having the excitation wavelength (e.g., green), and may be designed to be transparent to the fluoresced light F having the fluoresced wavelength (e.g., red). As a result, the excitation light X may propagate laterally along the RAM substrate 100 and excite color centers along the way. The fluoresced light F may pass through the bottom side of the RAM substrate 100 and to the fluoresced light detector 300. As such, the grating coupler 285 may increase the amount of fluoresced light F received by the fluoresced light detector 30 and therefore may increase the sensitivity and/or accuracy of the optical magnetometer 12 in comparison to the optical magnetometer 10 of FIG. 1.

Figure 5:
FIG. 5 depicts a magnetometer with a PCSEL with resonant atomic medium layer in accordance with various aspects of the present disclosure.

Referring now to FIG. 5, an optical magnetometer 14 is shown that comprises a PCSEL 204 that emits light into a resonant atomic medium (RAM) layer 400 positioned over a top side of the PCSEL 204. As shown, the optical magnetometer 14 may include a substrate 101, a PCSEL 204, a fluoresced light detector 301, and a RAM layer 400. In general, the PCSEL 204 emits light X having an excitation wavelength. The excitation light X may be directed into the RAM layer 400 and color centers embedded in the RAM layer 400 may fluoresce light Fin a manner that is dependent or otherwise indicative of a magnetic field experienced by the RAM layer 400. The fluoresced light detector 301 may receive the fluoresced light F and generate a fluoresced measurement signal indicative of the detected fluoresced light and thus also indicative of the magnetic field experienced by the RAM layer 400. In this manner, the optical magnetometer 14 may detect and/or measure a magnetic field proximate the optical magnetometer 14.

The substrate 101 may be implemented in a similar manner as the RAM substrate 100 of FIG. 1. In particular, the substrate 100 may comprise diamond or silicon carbide (SiC) embedded with color centers. However, unlike the RAM substrate 100, the substrate 101 does not receive excitation light X from the PCSEL 204. As such, the substrate 101 in some embodiments may lack color centers and/or may be implemented with other semiconductor or crystalline materials. In some embodiments, the substrate 101 may act as a heat sink due to its thermal properties. In particular, such thermal properties may provide temperature stabilization, which may help assure wavelength stability of the excitation light X emitted from the top side of the PCSEL 204 and into the bottom side of the RAM layer 400.

As shown, the PCSEL 204 may be constructed on the top side of the substrate 101 as a stack of layers. In particular, PCSEL stack may include a lower mirror 252, a lower cladding layer 210, an active region 220, a photonic crystal 230, and an upper cladding layer 240. In particular, a bottom side of the lower mirror 252 may be on the top side of the substrate 101, a bottom side of the lower cladding layer 210 may be on a top side of the lower mirror 252, and a bottom side of the active region 220 may be on a top side of the lower cladding layer 210. Further, a bottom side of the photonic crystal 230 may be on a top side of the active region 220, a bottom side of the upper cladding layer 240 may be on a top side of the photonic crystal 230, and a bottom side of the RAM layer 400 may be on a top side of the upper cladding layer 240.

The active region 220, photonic crystal 230, cladding layers 210, 240, contacts 260, 270, and electrical isolation regions 262, 272 may be implemented in a manner similar to the active region 220, photonic crystal 230, cladding layers 210, 240, contacts 260, 270, and electrical isolation regions 262, 272 of the optical magnetometer 10 of FIG. 1. Similarly, the lower mirror 252 may be implemented in a manner similar to the upper mirror 250 of FIG. 1, but positioned below the active region 220. As such, the lower mirror 252 may reflect the excitation light X toward the RAM layer 400 on the top side of the PCSEL 204. Moreover, similar to the RAM substrate 100 of FIG. 1, the RAM layer 400 may be transparent to the wavelength of the fluoresced light F and the wavelength of the excitation light X, thus permitting the fluoresced light detector 301 positioned over the PCSEL 204 to receive and detect the fluoresced light F.

As noted, the RAM layer 400 may be implemented similar to the RAM substrate 100 of FIG. 1. In particular, the RAM layer 400 may comprise a diamond layer embedded with nitrogen-vacancy (NV) centers. The NV centers may provide point defects or lattice vacancies in the diamond lattice structure that exhibit spin-dependent photoluminescence in the presence of a magnetic field. In particular, the NV centers may fluoresce red light F (e.g., light with a wavelength of about 750 nm) when excited by visible green light X (e.g., light with a wavelength of about 532 nm).

In some embodiments, the RAM layer 400 may comprise a silicon carbide (SIC) layer embedded with color centers from silicon-vacancies or other dopants. These color centers in the SiC lattice structure may exhibit spin-dependent photoluminescence in the presence of a magnetic field. In particular, the silicon-vacancy color centers may fluoresce light F with a wavelength of about 919 nm when excited by visible red light X (e.g., light with a wavelength of about 785 nm).

While diamond and silicon carbide are presented as examples of resonant atomic medium of the RAM layer 400, other crystalline structures may be embedded with color centers and may be used as the resonant atomic medium of the magnetometers disclosed herein. For such embodiments, the PCSEL 204 may be configured to develop excitation light X at a wavelength that is suitable to excite photoluminescence of the embedded color centers.

Similar to the fluoresced light detector 300 of FIG. 1, the fluoresced light detector 301 may be designed with a narrow pass band filter and/or a narrow wavelength detection range. Such narrow pass band may effectively filter the excitation light X from the fluoresced light F. In some embodiments, the fluoresced light detector 301 regardless of the presence or absence of a narrow pass band filter may be designed to otherwise extract or detect the fluoresced light F in the presence of the excitation light X.

As depicted the fluoresced light detector 301 may be placed over PCSEL 204 and RAM layer 400 and may receive excitation light X from the PCSEL 204 and fluoresced light F from the RAM layer 400. The fluoresced light detector 301 may be designed to detect a wavelength range of interest (e.g., a wavelength range including the fluoresced light F) and generate a fluoresced measurement signal indicative of the detected light in the wavelength range of interest and the magnetic field effects upon the fluoresced light F. For example, the fluoresced light detector 301 may be configured to detect fluoresced light F in a wavelength range of 600-800 nm when used with a diamond RAM layer 400 that fluoresces red light of about 750 nm. The fluoresced light detector 301 and/or magnetometer 14 may include additional filters that permit a narrow range of light to reach the detecting elements (e.g., photodiode) of the fluoresced light detector 301.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. For example, the disclosed magnetometers may include additional components such as a reference magnet, electrical driver, power monitors, etc. without departing from the scope of the present disclosure. Therefore, it is intended that the present disclosure not be limited to the examples disclosed, but that the disclosure will include all examples falling within the scope of the appended claims.

What is claimed is:

1. A magnetometer, comprising:
    a substrate comprising a substrate top side;
    a resonant atomic medium comprising color centers or other dopants;
    a photonic crystal surface emitting laser (PCSEL), wherein the resonant atomic medium is on a top side of the PCSEL, and wherein the PCSEL is on the substrate top side and is configured to direct excitation light into a bottom side of the resonant atomic medium; and
    a light detector configured to generate a measurement signal indicative of a magnetic field applied to the resonant atomic medium, wherein the light detector is positioned over a top side of the resonant atomic medium to receive fluoresced light from the top side of the resonant atomic medium.

2. The magnetometer of claim 1, wherein:

the color centers or other dopants form vacancies that fluoresce light when excited by an excitation light having an excitation wavelength; and the PCSEL is configured to develop the excitation light having the excitation wavelength of the vacancies and direct the excitation light into the resonant atomic medium.

3. The magnetometer of claim 2, wherein the PCSEL comprises a plurality of electrical contacts that electrically pump the PCSEL to develop the excitation light at the excitation wavelength.

4. The magnetometer of claim 1, wherein the resonant atomic medium comprises silicon carbide embedded with color centers or other dopants that form silicon-vacancies.

5. The magnetometer of claim 2, wherein:

the resonant atomic medium comprises silicon carbide embedded with color centers or other dopants that form silicon-vacancies;

the excitation light has a wavelength of about 785 nm; and the fluoresced light has a wavelength of about 919 nm.

6. The magnetometer of claim 1, wherein the resonant atomic medium comprises diamond embedded with color centers that form nitrogen-vacancy (NV) centers.

7. The magnetometer of claim 2, wherein:

the resonant atomic medium comprises diamond embedded with color centers that form nitrogen-vacancy (NV) centers;

the excitation light has a green light wavelength; and the fluoresced light has a red light wavelength.

8. The magnetometer of claim 2, wherein:

the resonant atomic medium comprises diamond embedded with color centers that form nitrogen-vacancy (NV) centers;

the excitation light has a wavelength of about 532 nm; and the fluoresced light has a wavelength of about 750 nm.

9. The magnetometer of claim 1, wherein the PCSEL comprises a lower mirror that directs the excitation light toward a bottom side of the resonant atomic medium.

10. The magnetometer of claim 2, comprising a plurality of PCSELs, wherein each PCSEL is configured to develop excitation light having an excitation wavelength of the vacancies and direct the excitation light into the resonant atomic medium.

11. A magnetometer, comprising:

a resonant atomic medium comprising color centers or other dopants;

a photonic crystal surface emitting laser (PCSEL), wherein the PCSEL comprises a grating coupler that couples excitation light into the resonant atomic medium at an angle; and a light detector configured to generate a measurement signal indicative of a magnetic field applied to the resonant atomic medium, and wherein one or more surfaces of the resonant atomic medium are configured to reflect the excitation light and permit passage of fluoresced light.

12. The magnetometer of claim 11, comprising:

a substrate comprising the resonant atomic medium;

wherein the PCSEL is over a top side of the substrate and is configured to direct excitation light into the top side of the substrate; and wherein the light detector is positioned below a bottom side of the substrate and receives fluoresced light from a bottom side of the substrate.

13. The magnetometer of claim 12, wherein the PCSEL comprises an upper mirror that directs the excitation light toward the top side of the substrate.

14. The magnetometer of claim 11, wherein the PCSEL comprises a meta optical surface that shapes excitation light emitted into the resonant atomic medium.

15. The magnetometer of claim 11, wherein:

the color centers or other dopants form vacancies that fluoresce light when excited by an excitation light having an excitation wavelength; and the PCSEL is configured to develop the excitation light having the excitation wavelength of the vacancies and direct the excitation light into the resonant atomic medium.

16. A method of a magnetometer, the method comprising:

emitting an excitation light from a photonic crystal surface emitting laser (PCSEL) into a resonant atomic medium comprising color centers or other dopants;

coupling, with a grating coupler, the excitation light into the resonant atomic medium at an angle;

reflecting with one or more surfaces of the resonant atomic medium the excitation light;

exciting, with the emitted excitation light, lattice vacancies formed by the color centers or other dopants of the resonant atomic medium;

in response to exciting the lattice vacancies, fluorescing a fluoresced light having characteristics dependent upon a magnetic field applied to the resonant atomic medium;

permitting passage of the fluoresced light through at least one surface of the one or more surfaces; and generating, with a light detector based on the fluoresced light, a measurement signal indicative of the magnetic field applied to the resonant atomic medium.

17. The method of claim 16, wherein exciting the lattice vacancies comprises exciting the lattice vacancies with excitation light from a plurality of PCSELs.

18. The method of claim 16, wherein the resonant atomic medium comprises silicon carbide embedded with color centers or other dopants that form silicon-vacancies.

19. The method of claim 16, wherein the resonant atomic medium comprises diamond embedded with color centers that form nitrogen-vacancy (NV) centers.

20. The method of claim 16, wherein emitting the excitation light comprises emitting the excitation light from a plurality of PCSELs into the resonant atomic medium.

21. The method of claim 16, comprising shaping the excitation light with a meta optical surface.

22. The magnetometer of claim 15, wherein:

the resonant atomic medium comprises silicon carbide embedded with color centers or other dopants that form silicon-vacancies;

the excitation light has a wavelength of about 785 nm; and the fluoresced light has a wavelength of about 919 nm.

23. The magnetometer of claim 15, wherein:

the resonant atomic medium comprises diamond embedded with color centers that form nitrogen-vacancy (NV) centers;

the excitation light has a green light wavelength; and the fluoresced light has a red light wavelength.

* * * * *